(12) United States Patent
Kobayashi et al.

(10) Patent No.: US 8,138,461 B2
(45) Date of Patent: Mar. 20, 2012

(54) INTEGRATED CIRCUIT DEVICE AND IMAGING APPARATUS USING INTEGRATED CIRCUIT DEVICE

(75) Inventors: Daisuke Kobayashi, Hatogaya (JP); Daisuke Yoshida, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 508 days.

(21) Appl. No.: 12/339,169

(22) Filed: Dec. 19, 2008

(65) Prior Publication Data

US 2009/0159784 A1    Jun. 25, 2009

(30) Foreign Application Priority Data

Dec. 20, 2007  (JP) ................. 2007-328737
Dec. 2, 2008   (JP) ................. 2008-307589

(51) Int. Cl.
   *H01L 27/00* (2006.01)
(52) U.S. Cl. .................................. 250/208.1
(58) Field of Classification Search ............ 250/208.1, 250/214 A, 214 LA, 214 P, 214 DC, 370.01, 250/370.02, 370.08, 370.09; 327/552, 553; 330/250, 252–261, 288, 290, 296, 299, 307, 330/310, 311; 360/66
See application file for complete search history.

(56) References Cited

U.S. PATENT DOCUMENTS

| 6,456,270 B1 * | 9/2002 | Itakura ............................ 345/98 |
| 2005/0264665 A1 * | 12/2005 | Endo et al. .................... 348/308 |
| 2007/0290143 A1 * | 12/2007 | Kameshima et al. .... 250/370.09 |

FOREIGN PATENT DOCUMENTS

JP          2003-057350 A     2/2003

* cited by examiner

*Primary Examiner* — Georgia Y Epps
*Assistant Examiner* — Renee Naphas
(74) *Attorney, Agent, or Firm* — Fitzpatrick, Cella, Harper & Scinto (57) ABSTRACT

An integrated circuit device of the present invention includes a plurality of signal processing circuits classified into a plurality of groups, each signal processing circuit including an amplifier circuit for amplifying an input electric signal and a bias circuit having an input terminal connected electrically to a bias source and supplying a bias input terminal of the amplifier circuit with an operation bias for an amplifying operation of the amplifier circuit; and a plurality of connection wirings arranged each for each of the groups separately, such that the input terminals of the bias circuits of the signal processing circuits in one of the groups are commonly connected through the connection wirings. This provides an integrated circuit device suppressing the lowering of an image quality in consideration of enabling lower power consumption, a low noise characteristic, and high integration, and an imaging apparatus using the integrated circuit.

14 Claims, 10 Drawing Sheets

INTEGRATED CIRCUIT DEVICE AND IMAGING APPARATUS USING INTEGRATED CIRCUIT DEVICE

BACKGROUND OF THE INVENTION

1. Field of the Invention

The present invention relates to a semiconductor integrated circuit device including a signal processing circuit for performing the signal processing of an imaging apparatus, an imaging apparatus including the semiconductor integrated circuit device, and a radiation imaging apparatus and radiation imaging system that use the semiconductor integrated circuit device. Incidentally, in the present description, it is supposed that a term of radiation includes an electromagnetic wave, an X-ray, an α-ray, a β-ray, a γ-ray, and the like.

2. Description of the Related Art

In an imaging apparatus including a detector including a plurality of pixels arranged in a matrix, an image signal from the detector is processed by using a semiconductor integrated circuit device including a plurality of signal processing circuits arranged in an array, which signal processing circuits process a signal output from the detector by the column. As a representative example of each of the signal processing circuits, an amplifier circuit amplifying a signal from a pixel can be given, here. Japanese Patent Application Laid-Open No. 2003-057350 discloses an imaging apparatus and a radiation imaging apparatus using the imaging apparatus, in which such integrated circuit device are formed on a plurality of semiconductor substrates separately from the detector and are mounted on the detector.

Such an imaging apparatus is required to have the signal processing circuits that operate at low consumption currents in order to suppress the power consumption of the whole apparatus. Moreover, the imaging apparatus is required to increase the dynamic range of the whole apparatus, and is required to have the signal processing circuits having low noise characteristics accordingly. In particular, an imaging apparatus to be used for a medical radiation imaging apparatus is required to process a very small signal in order to lessen the radiation irradiation quantity to a human body, and is required to have the signal processing circuits having lower noise characteristics. In addition, the imaging apparatus to be used for the radiation imaging apparatus is required to have a lower price for the spread thereof. Consequently, the imaging apparatus is also required to increase the number of the signal processing circuits to be integrated on a semiconductor integrated circuit device to decrease the number of the semiconductor integrated circuit device to be used. In addition, the imaging apparatus is also required to prevent the remarkable increase of the chip area of a semiconductor chip constituting a semiconductor integrated circuit device even if the number of the signal processing circuits to be integrated on the semiconductor integrated circuit device is increased. That is, it is required, in the semiconductor integrated circuit including the signal processing circuit for use in the imaging apparatus, to reduce a noise, reduce a power consumption and to reduce an area of the integrated circuit chip.

In order to meet the requirements mentioned above, a bias circuit supplying the operation biases for the amplifier circuits included in the signal processing circuits to perform their amplifying operations to the amplifier circuits fulfills an important role. U.S. Pat. No. 6,456,270 discloses bias circuits supplying bias currents for driving amplifier circuits arranged to be a linear column in an integrated circuit device. In the bias circuits disclosed in U.S. Pat. No. 6,456,270, the transistors on the input sides of the current mirror circuits constituting the bias circuits are arranged to be dispersed into the respective amplifier circuits. The bias circuits including bias current setting lines, power supply lines, and the input side transistors are hereby commonly arranged to the amplifier circuits of all of the signal processing circuits.

SUMMARY OF THE INVENTION

However, according to the configuration disclosed in U.S. Pat. No. 6,456,270, if the number of the signal processing circuits provided in a semiconductor integrated circuit device increases, then the wiring resistances of the bias current setting lines and the power supply lines and the potential gradients generated by the currents flowing through the bias current setting lines and the power supply lines increase. Consequently, a gradient is caused between the operation biases to be supplied to the amplifier circuits of the respective signal processing circuits, and then a gradient is caused between the operating points of the respective amplifier circuits. Consequently, a gradient is caused between the amplification characteristics of the respective amplifier circuits in the semiconductor integrated circuit device, and an output gradient of the image signals output from the respective amplifier circuits is caused in a row direction. Because the output gradient is conspicuous in an image signal, the output gradient remarkably lowers the image quality of the image signal output from the imaging apparatus.

The present invention is directed to a semiconductor integrated circuit device for an imaging apparatus suppressing the reduction of the image quality thereof in consideration of enabling low power consumption, a low noise characteristic, high integration, and an imaging apparatus using the semiconductor integrated circuit.

An aspect of the present invention is to provide an integrated circuit device comprising: a plurality of signal processing circuits classified into a plurality of groups, each signal processing circuit including an amplifier circuit having a bias input terminal and a bias circuit having an input terminal connected electrically to a bias source and an output terminal connected electrically to the bias input terminal for supplying an operation bias to the amplifier circuit; and a plurality of connection wirings arranged each for each of the groups separately, such that the input terminals of the plurality of bias circuits in one of the groups are commonly connected through one of the plurality of connection wirings.

Another aspect of the present invention is to provide an imaging apparatus comprising: a detector including a plurality of pixels each including a conversion element for converting a radiation or a light into an electric signal, and a plurality of signal lines for transmitting in parallel the electrical signals outputted from the pixels; and an integrated circuit device inputting the electrical signal transmitted in parallel, and comprising a plurality of signal processing circuits classified into a plurality of groups corresponding to the plurality of signal lines, each signal processing circuit including an amplifier circuit having a bias input terminal and for amplifying the electrical signal inputted, and a bias circuit having an input terminal connected electrically to a bias source and an out put terminal connected electrically to the bias input terminal for supplying the amplifier circuit with an operation bias; wherein the integrating circuit includes a plurality of connection wirings arranged each for each of the groups separately, such that the input terminals of the bias circuits of the plurality of signal processing circuits in one of the groups are commonly connected through one of the connection wirings.

According to the present invention, it is enabled to provide a semiconductor integrated circuit device for an imaging apparatus suppressing the reduction of the image quality thereof in consideration of enabling low power consumption, a low noise characteristic, and high integration, and an imaging apparatus using the semiconductor integrated circuit device.

Further features of the present invention will become apparent from the following description of exemplary embodiments with reference to the attached drawings.

DESCRIPTION OF THE EMBODIMENTS

Next, the embodiments of the present invention will be described in detail.

First Embodiment

Figure 2:
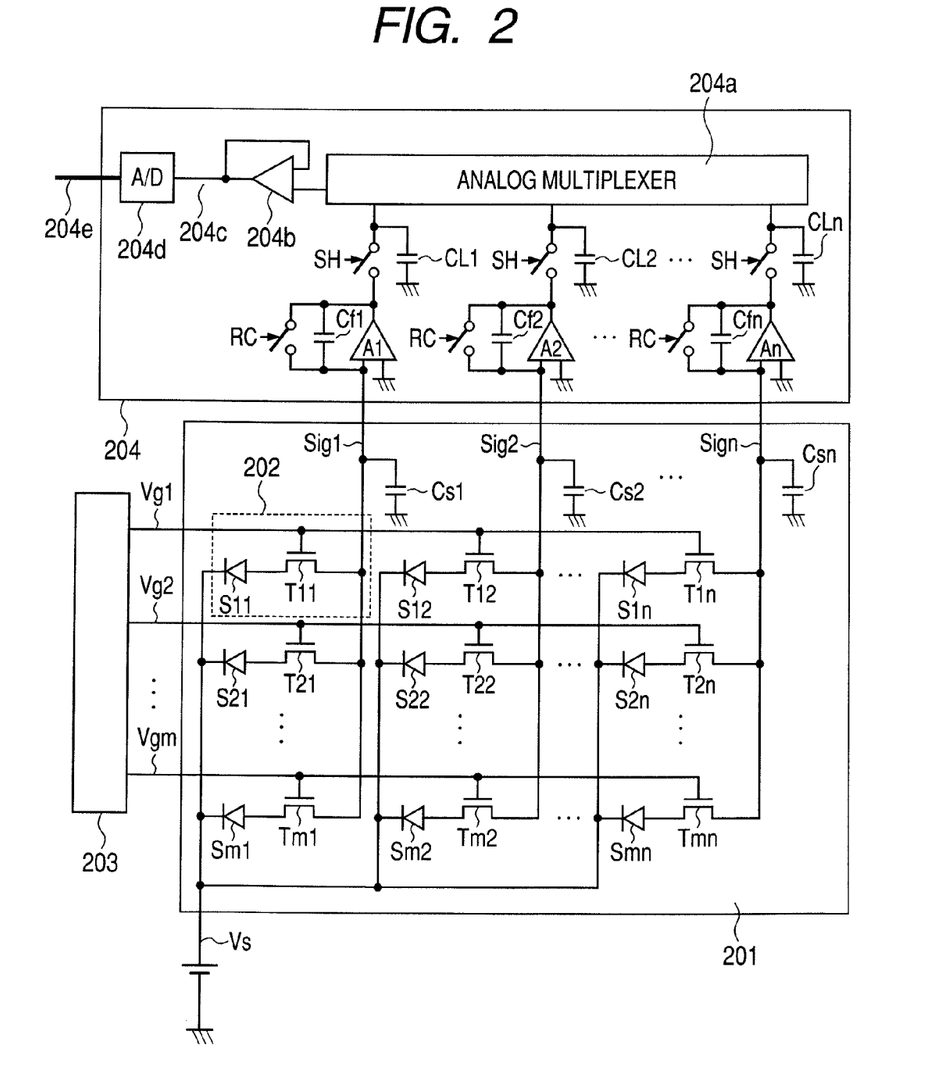
FIG. 2 is a schematic equivalent circuit diagram of the imaging apparatus according to the first embodiment of the present invention.

First, the whole configuration of an imaging apparatus of the present invention will be described with reference to FIG. 2. FIG. 2 illustrates a schematic equivalent circuit diagram of an imaging apparatus of a first embodiment of the present invention.

A detector 201 and a drive circuit 203 are connected to each other with m (m is a positive integer) drive lines Vg1-Vgm. Moreover, the detector 201 and a semiconductor integrated circuit device 204 are connected to each other with n (n is a positive integer) signal lines Sig1-Sign.

The detector 201 includes a plurality of two-dimensionally arranged pixels 202 each including each of conversion elements S11-Smn, which include photoelectric conversion elements, such as PIN type photodiodes, and each of switching elements T11-Tmn, which are made of thin film transistors (TFTs). That is, m×n pixels 202 are arranged in a matrix in the detector 201. The detector 201 is, for example, a flat panel type detector configured of amorphous silicon, as the chief material, formed on a glass substrate. If the detector 201 is used for a radiation imaging apparatus, then the detector 201 is further provided with a wavelength converter (not illustrated), such as phosphor, for performing the wavelength conversion of the wavelength of a radiation into that of a light, which is sensitive for the photoelectric conversion elements, on the incident side of the detector 201. In the present embodiment, the wavelength converter and the photoelectric conversion elements constitute the conversion elements S11-Smn for converting radiations into electric signals. Incidentally, the photoelectric conversion elements are included in the conversion elements S11-Smn as the elements for converting lights into electric signals, and the conversion elements S11-Smn can be configured only by the photoelectric conversion elements. In that case, the conversion elements S11-Smn convert lights into electric signals. That is, the conversion elements S11-Smn in the present invention can be said to be the ones for converting either radiations or lights into electric signals.

A sensor bias voltage is applied from a power source 111 to the common electrode side (the cathode side of a photodiode in FIG. 2) of each of the conversion elements S11-Smn of the pixels 202 through a bias line Vs. Moreover, the gate electrodes (control electrodes) of the switching elements T11-Tmn of the pixels 202 arranged in the row directions of the detector 201 are electrically connected to the drive lines Vg1-Vgm commonly, for example, by the row. Furthermore, the source electrodes that are ones of the main electrodes of the switching elements T11-Tmn of the pixels 202 arranged in the column directions of the detector 201 are electrically connected to the signal lines Sig1-Sign commonly, for example, by the column. Moreover, in each of the pixels 202, the drain electrode, which is the other one of the main electrodes of each of the switching elements T11-Tmn, is electrically connected to each of the conversion elements S11-Smn. The signal lines Sig1-Sign transmit the electric signals output from the plurality of pixels 202 in parallel, and the electric signals transmitted in parallel are input into the semiconductor integrated circuit device 204 in parallel.

The semiconductor integrated circuit device 204 amplifies the electric signals output from the respective pixels 202 in parallel by the column through the respective signal lines Sig1-Sign, and performs the serial conversion of the amplified signals to output the converted signals as image data (digital data). The semiconductor integrated circuit device 204 includes each of amplifier circuits A1-An, which is provided with one of capacities Cf1-Cfn and a switch between its inverting input terminal and its output terminal, and each of sampling and holding circuit units, which includes a switch and one of capacities CL1-CLn, on each of the signal lines Sig1-Sign. Furthermore, the semiconductor integrated circuit device 204 includes an analog multiplexer 204a, a buffer amplifier circuit 204b, and an A/D converter 204d. The signal lines Sig are electrically connected to the inverting input terminals of the amplifier circuits A1-An, and a reference power source supplying a reference voltage, which is a standard of the amplifying operations of the amplifier circuits A1-An, is connected to the non-inverting input terminals of the amplifier circuits A1-An.

Analog signals subjected to a serial conversion by the amplifier circuits A1-An, the analog multiplexer 204a, and the buffer amplifier circuit 204b are input into the A/D converter 204d through an analog data line 204c. Then, the A/D converter 204d converts the input analog signals into digital signals, and outputs the image data (digital data) through a digital output bus 204e.

Incidentally, although FIG. 2 illustrates the region of one semiconductor integrated circuit device 204 and one corresponding detector 201 in order to simplify their descriptions and their drawings, the whole apparatus has the form to be described in the following with reference to FIG. 3.

Figure 3:
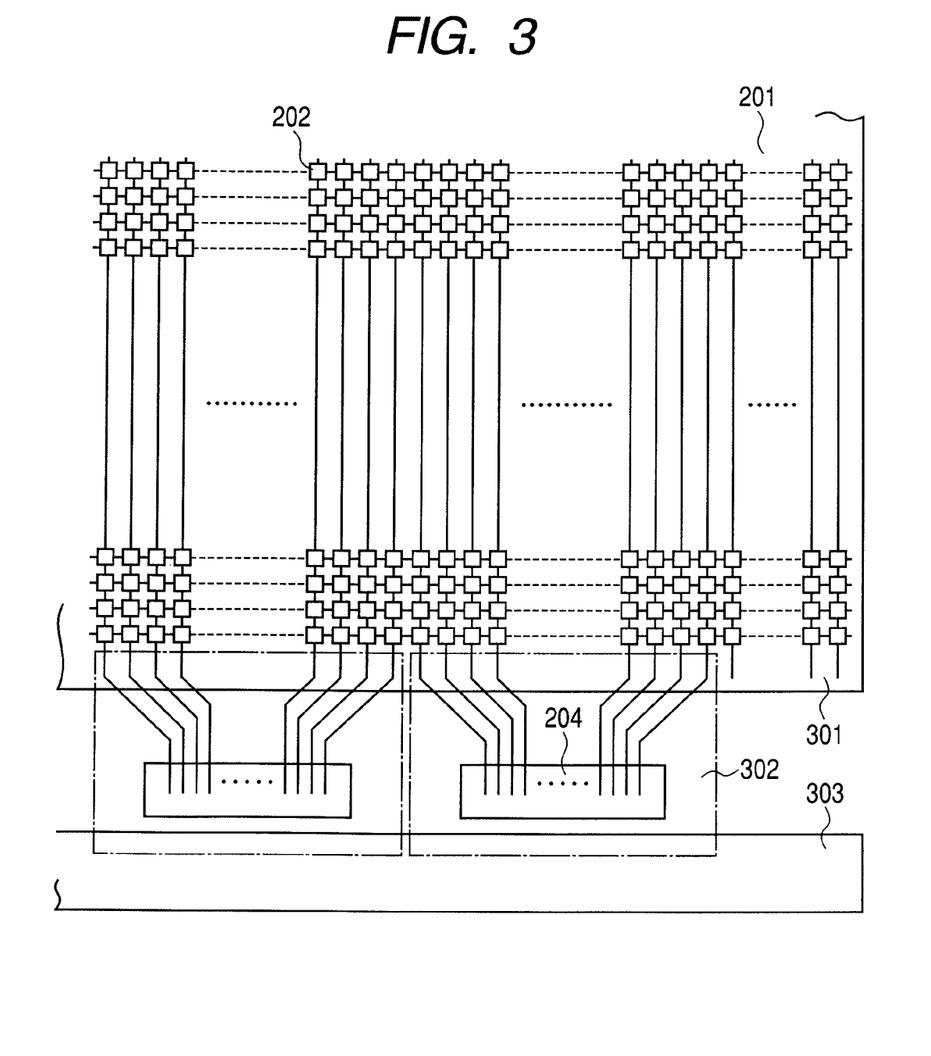
FIG. 3 is a plan view illustrating the schematic configuration of the imaging apparatus according to the first embodiment of the present invention.

FIG. 3 is a plan view illustrating the schematic configuration of the imaging apparatus of the first embodiment of the present invention illustrated in FIG. 2. The detector 201 is mounted on an insulation substrate 301, such as a glass substrate. The semiconductor integrated circuit device 204 are mounted on tape carrier packages (TCPs) 302, and one sides of the TCPs 302 are mounted in the peripheral regions of the detector 201 in order that the signal lines Sig and the semiconductor integrated circuit device 204 may be electrically connected. Moreover, the other sides of the TCPs 302 are mounted on a printed circuit board (PCB) 303, and the image signals from the semiconductor integrated circuit device 204 are output to the outside through the PCB 303. As illustrated in FIG. 3, the plurality of semiconductor integrated circuit device 204 is provided for the detector 201. If the detector 201 includes M rows by N columns of the pixels 202, then each of the semiconductor integrated circuit device 204 corresponds to n columns of the pixels 202, and N/n semiconductor integrated circuit device 204 are provided as the whole apparatus.

Figure 1:
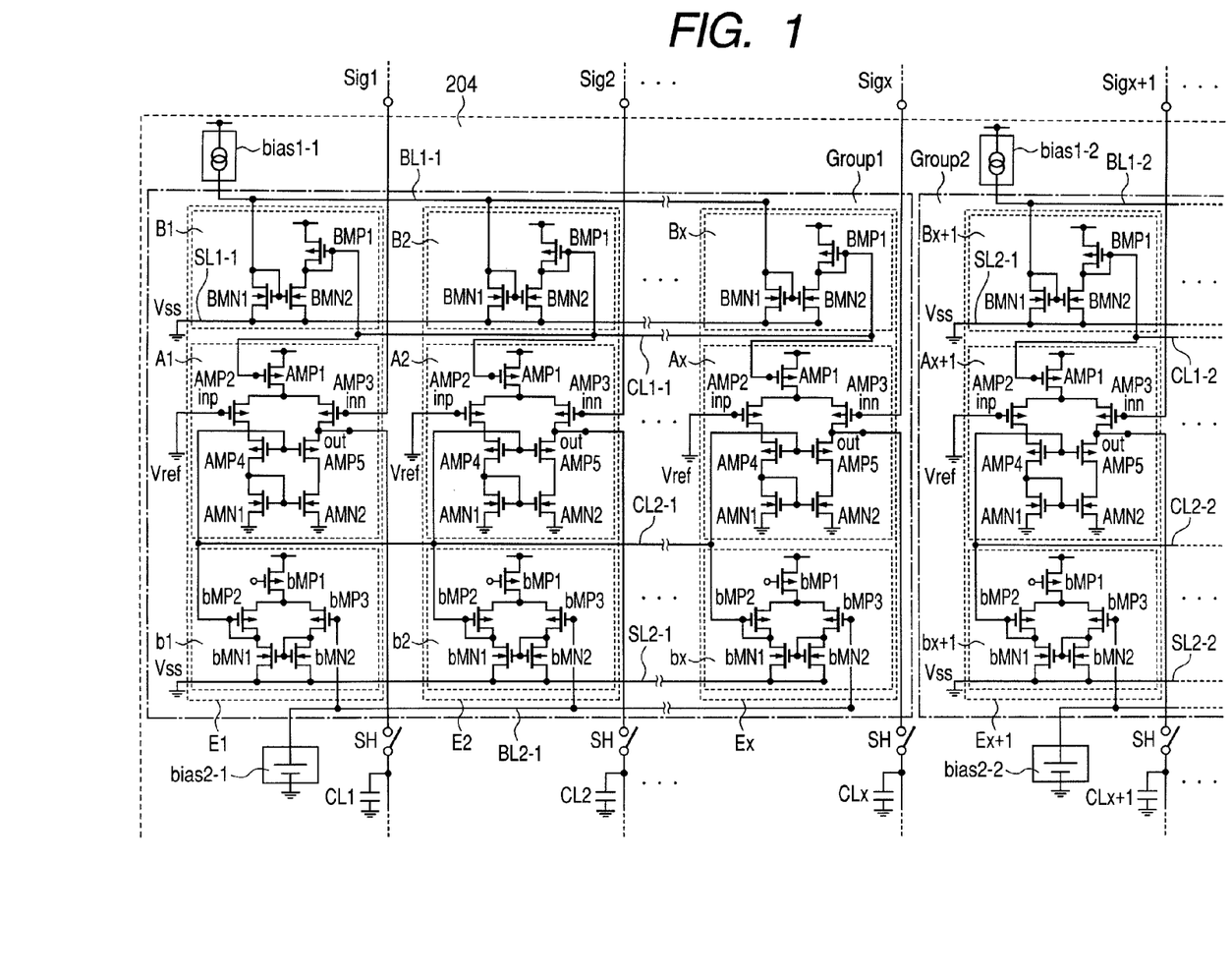
FIG. 1 is a schematic equivalent circuit diagram of a semiconductor integrated circuit device used for an imaging apparatus according to a first embodiment of the present invention.

Next, the semiconductor integrated circuit device 204 to be used for the imaging apparatus of the present invention will be described with reference to FIG. 1. FIG. 1 is a schematic equivalent circuit diagram of a part of one of the semiconductor integrated circuit device 204 to be used for the imaging apparatus according to the first embodiment of the present invention. Incidentally, the capacities Cf1-Cfn, the switches, a sampling and holding circuit portion, an analog multiplexer 204a, a buffer amplifier circuit 204b and an A/D converter 204d, which are illustrated in FIG. 2, are omitted in FIG. 1 for the simplification of the description of the circuit diagram and the drawing.

In FIG. 1, the semiconductor integrated circuit device 204 includes each of the amplifier circuits A1-An on each of the signal lines Sig1-Sign, as illustrated in FIG. 2. Moreover, first bias circuits B1-Bn for supplying operation biases for making the amplifier circuits A1-An perform their amplifying operations are provided correspondingly to the amplifier circuits A1-An. That is, the integrated circuit device 204 is provided with a signal processing circuit E1 including the amplifier circuit A1 and the first bias circuit B1 correspondingly to the signal line Sig1 on a first column, and a signal processing circuit E2 including the amplifier circuit A2 and the first bias circuit B2 correspondingly to the signal line Sig2 on a second column. Then, the integrated circuit device 204 is provided with a signal processing circuit Ex including the amplifier circuit Ax and the first bias circuit Bx correspondingly to the signal line Sigx on a $x^{th}$ column. That is, the semiconductor integrated circuit device 204 includes signal processing circuits E1-En correspondingly to the signal lines Sig1-Sign of every column of the detector 201.

An amplifier circuit A of the present embodiment includes a transistor AMP1, which is the current source of the amplifier circuit A, and transistors AMP2 and AMP3, which are an input differential pair, transistors AMN1 and AMN2, which are active loads, and transistors AMP4 and AMP5 constituting a common-gate circuit. The gate of the transistor AMP1, which is the current source, works as the bias input terminal of the amplifier circuit A. The common-gate circuit of the amplifier circuit A enables the amplification gain of the amplifier circuit A to be enlarged. The gates of the transistors AMP4 and AMP5 work as the bias input terminals of the common-gate circuit. The amplifier circuit A of the present embodiment has two signal input terminals as a non-inverting input terminal and an inverting input terminal, a signal output terminal out, so as to be configured as the so-called differential amplifier circuit. The transistors AMP1-AMP5 are p-channel metal-oxide semiconductor (PMOS) transistors, and the transistors AMN1-AMN2 are n-channel metal-oxide semiconductor (NMOS) transistors here. One of the signal lines Sig is electrically connected to the inverting input terminal inn of the amplifier circuit A, and one of the sampling and holding circuit units is electrically connected to the signal output terminal out of the amplifier circuit A. Moreover, the non-inverting input terminal inp of the amplifier circuit A is electrically connected to a reference power source Vref supplying the standard potential of the amplifier circuit A. Incidentally, the reference power source Vref supplies a reference potential for providing a reference signal as a reference of an amplifying operation to the non-inverting input terminal of the amplifier circuit. Accordingly, the reference potential is to be supplied to the signal input terminal of the amplifier circuit, different from the operation bias for amplifying operation of the amplifier circuit A.

A first bias circuit B of the present embodiment includes transistors BMN1 and BMN2 constituting a current mirror circuit, and a transistor BMP1, which is an outputting element of the first bias circuit B. A constant current source bias1, which is a bias source, is electrically connected to the drain and gate of the transistor BMN1, which is an inputting element of the bias circuit B, through a bias (current setting) line BL1. On the other hand, a constant potential source Vss giving constant electric potential, such as the ground potential, is connected to the sources of the transistors BMN1 and BMN2 though a power supply line SL1. The drain of the transistor BMN2 is connected to the drain and gate of the transistor BMP1, and the gate of the transistor BMP1 and the gate of the current source transistor AMP1 of the amplifier circuit A are connected to each other to constitute a current mirror circuit. In the present embodiment, the drain and gate of the transistor BMN1 and the sources of the transistors BMN1 and BMN2 are the outside input terminals of the first bias circuit B, and are electrically connected to the bias sources, such as the constant current source bias1 and the constant potential source Vss. Moreover, the drain and gate of the transistor BMP1 give a bias to the gate of the transistor AMP1, which is the bias input terminal of the amplifier circuit A. That is, the drain and gate of the transistor BMP1 are also the output terminals of the bias circuit B, and is electrically connected to the bias input terminal of the amplifier circuit A. The transistor BMP1 is a PMOS transistor, and the transistors BMN1-BMN2 are NMOS transistors, here.

Moreover, a signal processing circuit E of the present embodiment includes a second bias circuit b giving a gate bias to the gates of the transistors AMP4 and AMP5 of the common-gate circuit of the amplifier circuit A. Also the second bias circuit b supplies the operation bias for making the amplifier circuit A perform an amplifying operation. The signal processing circuit E1 is provided with a second bias circuit b1 corresponding to the common-gate circuit of the amplifier circuit A1, and the signal processing circuit E2 is provided with a second bias circuit b2 corresponding to the common-gate circuit of the amplifier circuit A2. Then, the signal processing circuit Ex is provided with a second bias circuit bx corresponding to the common-gate circuit of the amplifier circuit Ax. That is, the semiconductor integrated circuit device 204 includes the second bias circuits b1-bn correspondingly to the signal processing circuits E1-En. The second bias circuit b includes a transistor bMP3, which is an inputting element, transistors bMN1 and bMN2 constituting a current mirror circuit, a transistor bMP2, which is an outputting element, and a transistor bMP1, which is a current source. A constant voltage source bias2, which is a bias source, is electrically connected to the gate of the transistor bMP3, which is the inputting element of the second bias circuit b, through a bias line BL2. On the other hand, the constant potential source Vss giving the constant electric potential, such as the ground potential, is connected to the sources of the transistors bMN1 and bMN2 through a power supply line SL2. The drain of the transistor bMN1 is connected to the drain and gate of the transistor bMP2, and the gate of the transistor bMP2 is connected to the gates of the transistors AMP4 and AMP5 of the common-gate circuit of the amplifier circuit A. In the present embodiment, the gate of the transistor bMP3 and the sources of the transistors bMN1 and bMN2 work as the outside input terminals connected to the bias sources, such as the constant voltage source bias2 and the constant potential source Vss. Moreover, the drain and gate of the transistor bMP2 give a bias to the gates of the transistors AMP4 and AMP5, which are the base bias input terminals of the amplifier circuit A, and the drain and gate of the transistor bMP2 work as the output terminals of the second bias circuit b. The transistors bMP1-bMP3 are PMOS transistors, and the transistors bMN1-bMN2 are NMOS transistors, here. Incidentally, the constant voltage source bias2 gives the bias to the transistor bMP3 in conjunction with the reference power source Vref supplying the standard potential to the non-inverting input terminal inp of the amplifier circuit A.

In the present embodiment, the plurality of signal processing circuits E1-En of the semiconductor integrated circuit 204 is classified into a plurality of groups. In the present embodiment, the signal processing circuits E1-Ex among the signal processing circuits E1-En are included in a first group (Group 1), which is one of the groups. Then, a plurality of that sort of groups is provided, and is included in each of the semiconductor integrated circuits 204. A letter x indicates a natural number that is within a range from 2 to n, both inclusive, and is a divisor of n, here. That is, the semiconductor integrated circuit device 204, including the n signal processing circuits E corresponding to the m rows by n columns of the pixels 202 of the detector 201, is provided with the x signal processing circuits E in each of the groups and the n/x of that sort of groups. Then, the outside input terminals of the bias circuits B1-Bn and b1-bn are connected to the respective common connection wirings in each of the groups. In the present embodiment, the drain and gate of the transistor BMN1 of each of the first bias circuits B1-Bn is connected to one another with the bias line BL1 in each of the groups, and the sources of the transistors BMN1 and BMN2 of the first bias circuits B1-Bn are connected to one another with the power supply line SL1 in each of the groups. Moreover, the gate of the transistor bMP3 of each of the second bias circuits b1-bn is connected to one another with the bias line BL2 in each of the groups, and the sources of the transistors bMN1 and bMN2 of each of the second bias circuits b1-bn are connected to one another with the power supply line SL2 in each of the groups.

Then, the connection wirings connecting the outside input terminals of each of the bias circuits B1-Bn and b1-bn with one another in common are separated in each of the groups. That is, the plurality of signal processing circuits E1-En in each of the semiconductor integrated circuit device 204 is classified into the plurality of groups, and each of the semiconductor integrated circuit device 204 includes the plurality of connection wirings separately provided in each of the groups. Then, the outside input terminals of each of the bias circuits B1-Bn and b1-bn are commonly connected with one another with the connection wirings separately provided in each of the groups. In the present embodiment, the first bias circuits B1-Bx among the first bias circuits B1-Bn belong to the first group (Group 1). Then the drains and gates of the transistors BMN1 in the first bias circuits B1-Bx are connected to one another with the bias line BL1-1 separated from the bias line BL1-2 of a second group (Group 2), which is another group. Moreover, the sources of the transistors BMN1 and BMN2 of the first bias circuits B1-Bx are connected to one another with the power supply line SL1-1 separated from the power supply line SL1-2 of the second group (Group 2), which is the other group. Moreover, in the present embodiment, the second bias circuits b1-bx among the second bias circuits b1-bn belong to the first group (Group 1). Then, the sources of the transistors bMN1 and bMN2 in the second bias circuits b1-bx are connected with one another with the bias line BL2-1 separated from the bias line BL2-2 of the second group (Group 2), which is the other group. Furthermore, the gates of the transistors bMP3 in the second bias circuits b1-bx are connected with one another with the power supply line SL2-1 separated from the power supply line SL2-2 in the second group (Group 2), which is the other group. Incidentally, the number of the groups classified in each of the semiconductor integrated circuit device 204 is n/x, which is the number obtained by dividing the number n of the total signal processing circuits E1-En in the semiconductor integrated circuit device 204 by the number x of the signal processing circuits E1-Ex in each of the groups. The number n/x of the groups is desirably 10 or more. This is because the variations of consecutive image signals are desirably the one tenth or less of noise components generated in a random manner. The potential gradients generated by the wiring resistances of the connection wirings, such as the bias lines BL and the power supply lines SL, and the currents flowing through the connection wirings are hereby separated, and the output gradients of the image signals in the row directions accompanying the potential gradients are separated. This reduces the output gradients of the image signals, and disperses the output gradients in the row directions. Consequently, the remarkable degrading of the image qualities of the image signals can be suppressed. And, connecting a plural number X of the external input terminals of the bias circuits is equivalent to effectively multiplying by X a gate width of a transistor as being an external input terminal. A flicker noise of the transistor is inverse proportional to a product of a gate width by multiplied by gate length of the transistor. Accordingly, a noise originated from the bias circuit in the signal processing circuit would be reduced into $1/X^{1/2}$ of a noise generated in case of a configuration of non-common connection.

The connection wirings connecting the outside input terminals of each of the bias circuits B1-Bn and b1-bn in common are then separated into each of the groups. That is, the plurality of signal processing circuits E1-En of each of the semiconductor integrated circuit device 204 is classified into the plurality of groups, and each of the semiconductor integrated circuit device 204 includes the plurality of connection wirings provided in each of the groups separately. The outside input terminals of each of the bias circuits B1-Bn and b1-bn are commonly connected with the connection wirings provided in each of the groups separately. In the present embodiment, the first bias circuits B1-Bx among the first bias circuits B1-Bn belong to the first group (Group 1). The drains and gates of the transistors BMN1 of the first bias circuits B1-Bx are then connected with one another with the bias line BL1-1 separated from the bias line BL1-2 of the second group (Group 2), which is the other group. Moreover, the sources of the transistors BMN1 and BMN2 in the first bias circuits B1-Bx are connected to one another with the power supply line SL1-1 separated from the power supply line SL1-2 of the second group (Group 2), which is the other group. Moreover, in the present embodiment, the second bias circuits b1-bx among the second bias circuits b1-bn belong to the first group (Group 1). The sources of the transistors bMN1 and bMN2 of the second bias circuits b1-bx are then connected with one another with the bias line BL2-1 separated from the bias line BL2-2 of the second group (Group 2), which is the other group. Furthermore, the gates of the transistors bMP3 in the second bias circuit b1-bx are connected with one another with the power supply line SL2-1 separated from the power supply line SL2-2 of the second group (Group 2), which is the other group. Incidentally, the number of the groups classified in each of the semiconductor integrated circuit device 204 is n/x, which is obtained by dividing the number n of the total signal processing circuits E1-En in the semiconductor integrated circuit device 204 by the number x of the signal processing circuits E1-Ex in each of the groups. The number n/x of the groups is desirably 10 or more. This is why the variations of consecutive image signals are desirably one tenth or less of the noise components generated in a random manner. The potential gradients generated by the wiring resistances of the connection wirings, such as the bias lines BL and the power supply lines SL, and the currents flowing through the connection wirings are hereby separated, and the output gradients of the image signals in the row directions, which accompany the potential gradients, are separated. This reduces the output gradients of the image signals and disperses the output gradients into the row directions, and consequently the remarkable lowering of the image qualities of the image signals can be suppressed.

Figure 4:
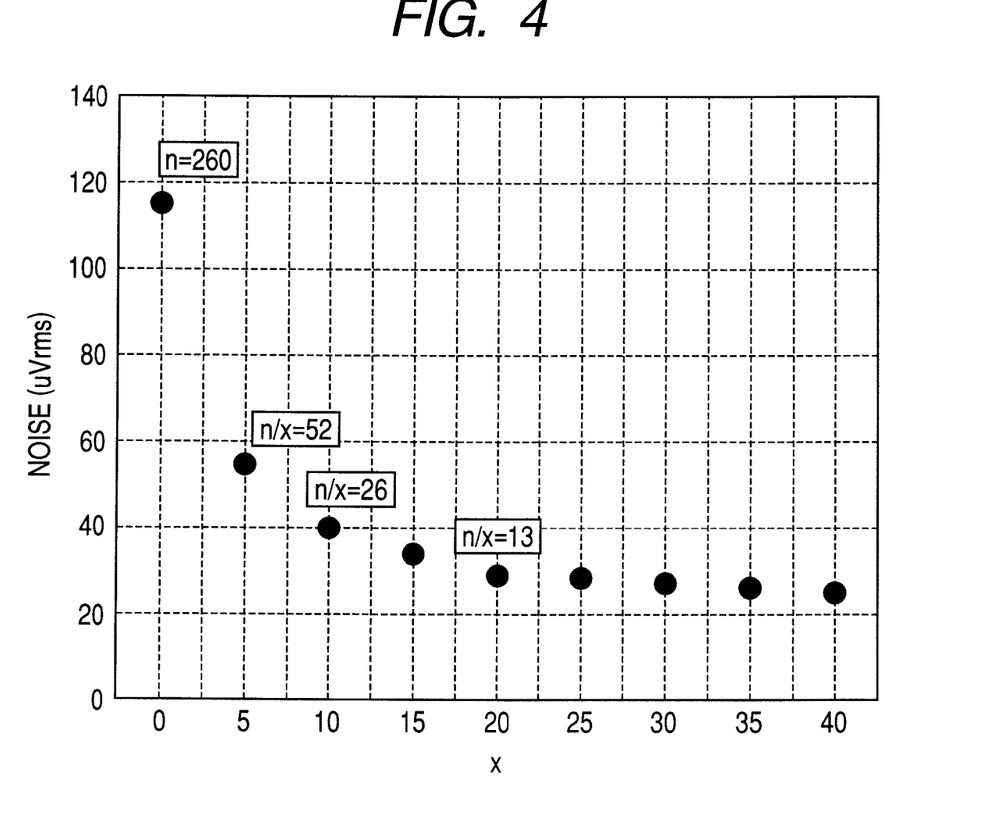
FIG. 4 is a graph illustrating the results of a simulation performed with regard to the relation between the number x of signal processing circuits and noise outputs.

Furthermore, in the present embodiment, the output terminals of each of the bias circuits B1-Bn and b1-bn in each group is commonly connected with the connecting wirings, and the output terminals are commonly connected to the bias input terminals of each of the amplifier circuits A1-An. In the present embodiment, the gates of the transistors BMP1 in the first bias circuits B1-Bx belonging to the first group (Group 1) are commonly connected with a connecting wiring CL1-1 separated from a connecting wiring CL1-2 of the second group (Group 2), which is the other group. Then, the gates of the transistors BMP1 in the first bias circuits B1-Bx and the connecting wiring CL1-1 are commonly connected to the gates of the transistors AMP1 in the corresponding amplifier circuits A1-Ax. Moreover, in the present embodiment, the drains and gates of the transistors bMP2 in the second bias circuits b1-bx belonging to the first group among the second bias circuits b1-bn are connected with one another with a connecting wiring CL2-1 separated from a connecting wiring CL2-2 in the second group, which is the other group. Then, the drains and gates of the transistors bMP2 and the connecting wiring CL2-1 in the second bias circuits b1-bx are commonly connected to the gates of the transistors AMP4 and AMP5, which are the input terminals of the common-gate circuits of the corresponding amplifier circuits A1-Ax. The connection of the x output terminals of the bias circuits B1-Bn and b1-bn severally in such a way is equivalent to multiplying each of the gate widths of the transistors functioning as the output terminals by x in effect. Since the level of the flicker noises of a transistor is inversely proportional to a product of the gate width of the transistor and the gate length thereof, the level of the noises of each of the signal processing circuits E1-En arising from the bias circuits B1-Bn and b1-bn becomes about one over the square root of x of the level of the noises of a form in which the output terminals of the bias circuits B1-Bn and b1-bn are not commonly connected with one another. A simulation with regard to the number x of the signal processing circuits E1-Ex included in one group and the level of the noise outputs of the single processing circuits E1-Ex was carried out here. FIG. 4 shows the results. The simulation illustrated in FIG. 4 was carried out with regard to the form in which 260 signal processing circuits E1-En are arranged in one semiconductor integrated circuit device 204. In FIG. 4, because the effects of the noises arising from the bias circuits B1-Bn and b1-bn were improved when the number x of the signal processing circuits E1-Ex included in the group was increased, the noise characteristics of the signal processing circuits E1-En were reduced. Then, when the number x was set to be 20, the noise characteristics were reduced by about 95%, and even if the number x was increased any more, the noise characteristic reducing effects of the signal processing circuits E1-En were not improved by leaps and bounds. Consequently, the number x is preferably 20 or more with regard to the noise characteristic reducing effect of the signal processing circuits E1-En, and the number n/x is thus desirably 13 or less. If the above-described effect to the potential gradients and the noise characteristic reducing effect of the signal processing circuits E1-En are considered together, then the number n/x of the groups in each of the semiconductor integrated circuit device 204 is desirably within a range from 10 to 13, both inclusive. And, in FIG. 1, in order to reduce the power consumption, it would be advantageous to design smaller a constant current to be inputted to the external input terminal of the first bias circuit B in FIG. 1, and to design larger a ratio between gate widths of BMP1 and AMP1 (mirror ratio R (R is a real number)). By using a configuration shown in FIG. 1, an effective mirror ratio can be reduced. Noises generated BMN1, BMN2 and BMP1 in the first bias circuit 5 are reduced into R/x times and transmitted to the amplifier circuit A. Accordingly, noise characteristics of the signal processing circuit would be improved. Moreover, a power consumption and layout area of the amplifier circuit A are almost defined by a required performance. When the power consumption and layout area of the first bias circuit B in FIG. 1 are designed so as to be as small as possible, as a result, the mirror ratio R between the BMP1 and the AMP1 would be larger at some extent. When there is a larger difference between the power consumptions of the first bias circuit B and the amplification circuit A, that is, the mirror ratio R is larger, the present invention can be effectively applied to reduce the effective mirror ratio R, thereby improving the noise characteristics of the amplification circuit. That is, when the power consumption W1 of the amplification circuit A and the power consumption W2 of the first bias circuit B in FIG. 1 is in a relation: W1>W2, the advantage of the present invention would be larger and the noise characteristics would be improved.

According to the present invention, the external input terminals of respective bias circuits are connected commonly group by group through the common connection wirings, thereby suppressing the significant degrading the image quality due to the output gradient. Moreover, by connecting the output terminals of the respective bias circuits group by group to be connected commonly to the bias input terminals of the respective amplifier circuits, the image signal derived thereby can be made low noise signal. Further, an arranging the bias circuits separately from one another provides a freedom of circuit design suitably achieving the low power consumption and smaller area of the semiconductor circuit and suitably adaptable to the image signal characteristics required can be made larger. Thereby, further, in the semiconductor integrated circuit device including the signal processing circuit for use in the imaging apparatus, required low noise, low power consumption and smaller area can be provided desirably according to the present invention.

Incidentally, the signal processing circuits of the present invention are not limited to the form described in the present embodiment, but various forms can be used. Examples of other signal processing circuits will be described with reference to FIGS. 5A, 5B, and 5C. Incidentally, each of FIGS. 5A to 5C severally illustrates one signal processing circuit for simplification of descriptions and drawings.

Figure 5A:
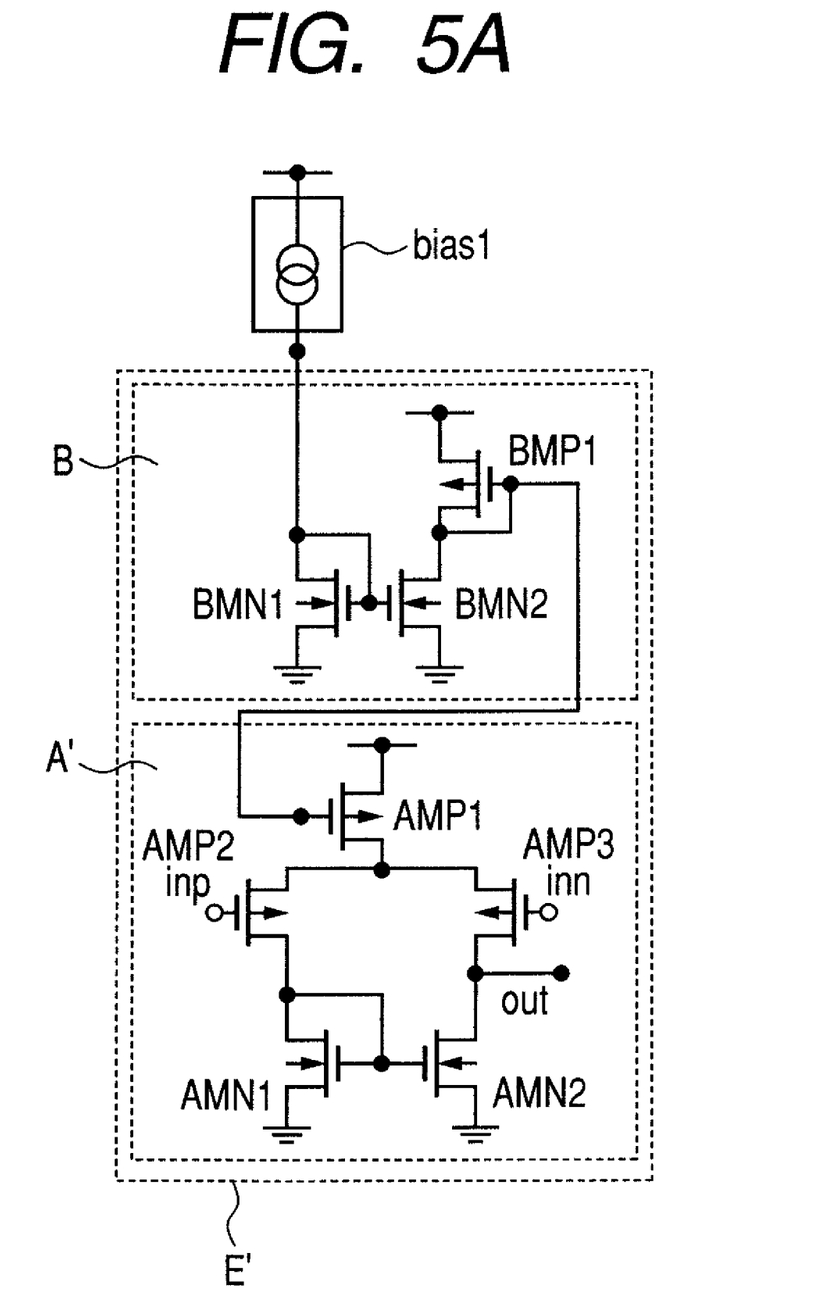
FIG. 5A is a schematic equivalent circuit diagram illustrating an example of a signal processing circuit applicable to the present invention.
Figure 5B:
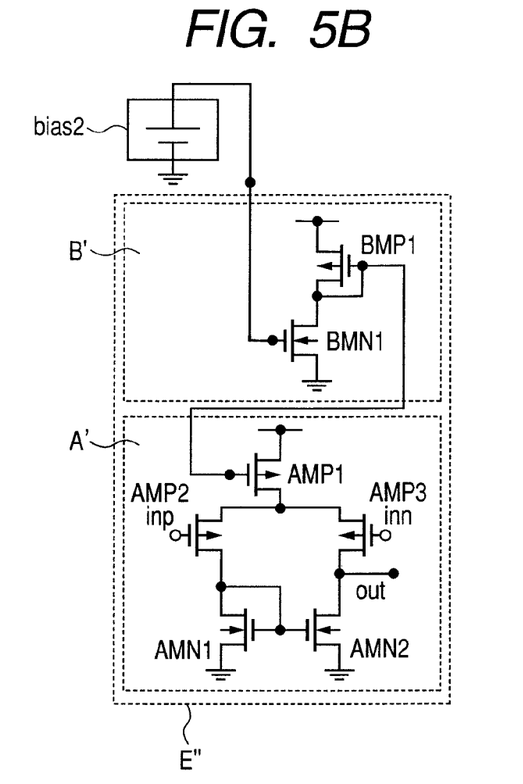
FIG. 5B is a schematic equivalent circuit diagram illustrating an example of a signal processing circuit applicable to the present invention.
Figure 5C:
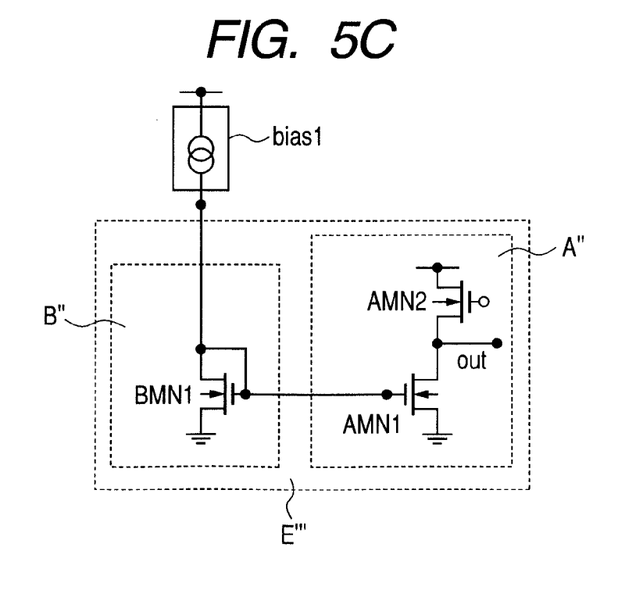
FIG. 5C is a schematic equivalent circuit diagram illustrating an example of a signal processing circuit applicable to the present invention.

FIG. 5A is a schematic equivalent circuit diagram of a first example of the signal processing circuits applicable to the present invention. In the first example, the transistors AMN1 and AMN2 of the amplifier circuit A of FIG. 1, which transistors AMN1 and AMN2 constitute a common-gate circuit, are omitted in an amplifier circuit A' in a signal processing circuit E'. Moreover, the second bias circuit b1 is omitted as well. The other configuration of the signal processing circuit E' is the same as that of the signal processing circuit E1 described with reference to FIG. 1, and the description of the residual configuration is omitted accordingly. FIG. 5B is a schematic equivalent circuit diagram of a second example of the signal processing circuits applicable to the present invention. A first bias circuit B' of the second example is configured by using the transistor BMN1 having the gate connected to a constant voltage source bias2 in place of the current mirror circuit composed of the transistors BMN1 and BMN2 in the first bias circuit B of the first example. Moreover, the second example uses the constant voltage source bias2 in place of the constant current source bias1 of the first example in association with the change of the current mirror circuit. The other configuration of the signal processing circuit E'' is the same as that of the first example, and the description of the configuration is omitted accordingly. FIG. 5C is a schematic equivalent circuit diagram of a third example of the signal processing circuits applicable to the present invention. The transistors BMN2 and BMP1 in the first bias circuit B' of the first example are omitted in the first bias circuit B''' in the third example, and the gate and drain of the transistor BMN1 in the third example is used as an output terminal. Moreover, the amplifier circuit A'' of the third example is a source follower circuit using the transistor AMN1 as an input transistor and the transistor AMN2 as a load. Such a configuration is used in the case of outputting an input signal with the amplification gain thereof being about one to transmit the input signal to the following stage, and in the case of shifting the level of an input signal to output the shifted input signal in order to transmit the input single to the following stage. The signal processing circuit E''' constitutes a current mirror circuit composed of the transistor BMN1 in the first bias circuit B''' and the input transistor AMN1 of the source follower circuit. The other signal processing circuits described here are only the examples, and various amplifier circuits, bias circuits, and second bias circuits can be suitably combined. Incidentally, the constant current sources and the constant voltage sources as the bias sources are suitably selected according to the configuration of a signal processing circuit to be used.

Moreover, although the present embodiment has been described by using the imaging apparatus in which the detector 201 and the semiconductor integrated circuit device 204 are mutually formed on the separated substrates 301 and 302, respectively, the present invention is not limited to the configuration of the present embodiment. The present invention can be applied also to the imaging apparatus in which the detector 201 and the semiconductor integrated circuit device 204 are prepared on the same semiconductor substrate. As an example of the detector prepared on a semiconductor substrate, FIG. 6 illustrates the schematic equivalent circuit diagram of a detector using amplifying pixels, such as CMOS sensors.

Figure 6:
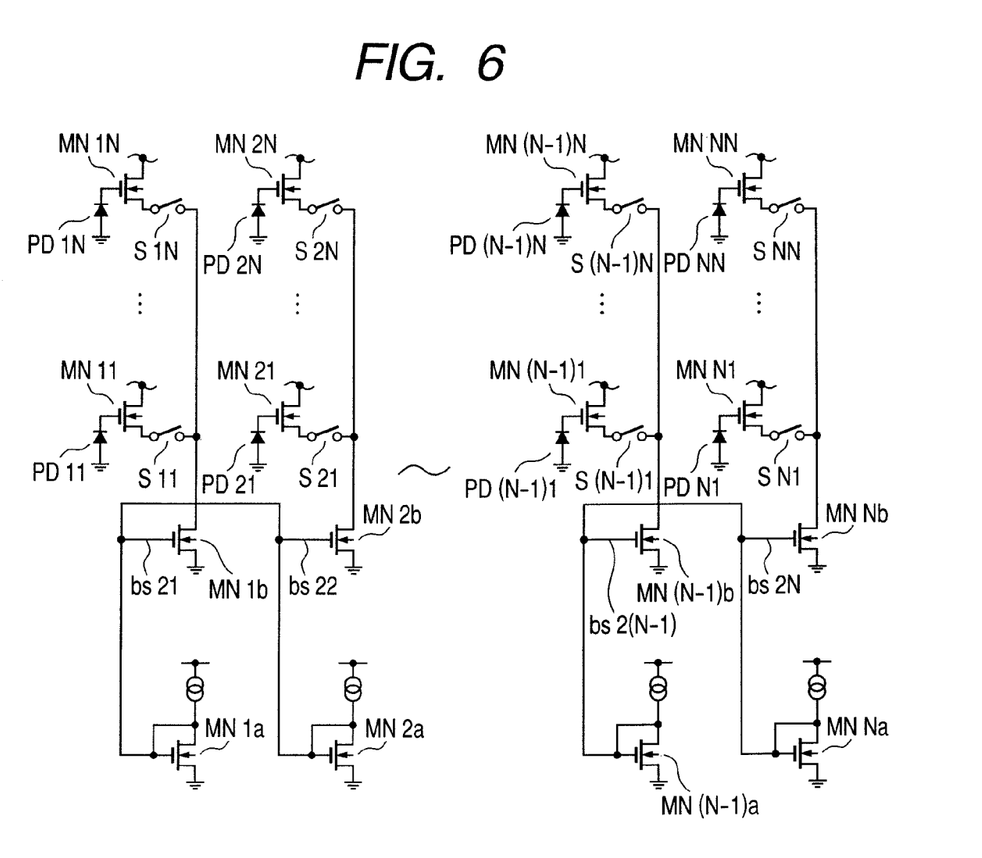
FIG. 6 is a schematic equivalent circuit diagram illustrating another detector applicable to the imaging apparatus of the present invention.

In the configuration of FIG. 6, the detector includes photodiodes PD11-PDNN, source followers MN11-MNNN, and current sources MN1b-MNNb. The source followers MN11-MNNN are connected to the current sources MN1b-MNNb to constitute source follower circuits. The outputs of the photodiodes PD11-PDNN are amplified by the source follower circuits to be output. The gate terminals of the current sources MN1b-MNNb, which are loads of the source follower circuits, and the gate terminals and drain terminals of bias circuits MN1a-MNNa are connected, respectively, to constitute current mirror circuits. Moreover, the outputs of the source follower circuits are common in each column, and the photodiodes PD11-PDNN are selected by switches S11-SNN, respectively. The configuration of sharing the loads of the source follower circuits in common in each column reduces the enlargement of the layout area thereof accompanying the increase of the number N of the arranged loads. If every two of output terminals bs21-bs2N in the bias circuits MN1a-MNNa is connected, then the gate widths of the transistors constituting the bias circuits MN1a-MNNa effectively becomes two times. Since the noises arising from the bias circuits MN1a-MNNa becomes about one over the square root of two in comparison with those of the configuration in which the output terminals bs21-bs2N are not connected every two of them, the noises of the outputs of the source follower circuits reduce.

Second Embodiment

Figure 7:
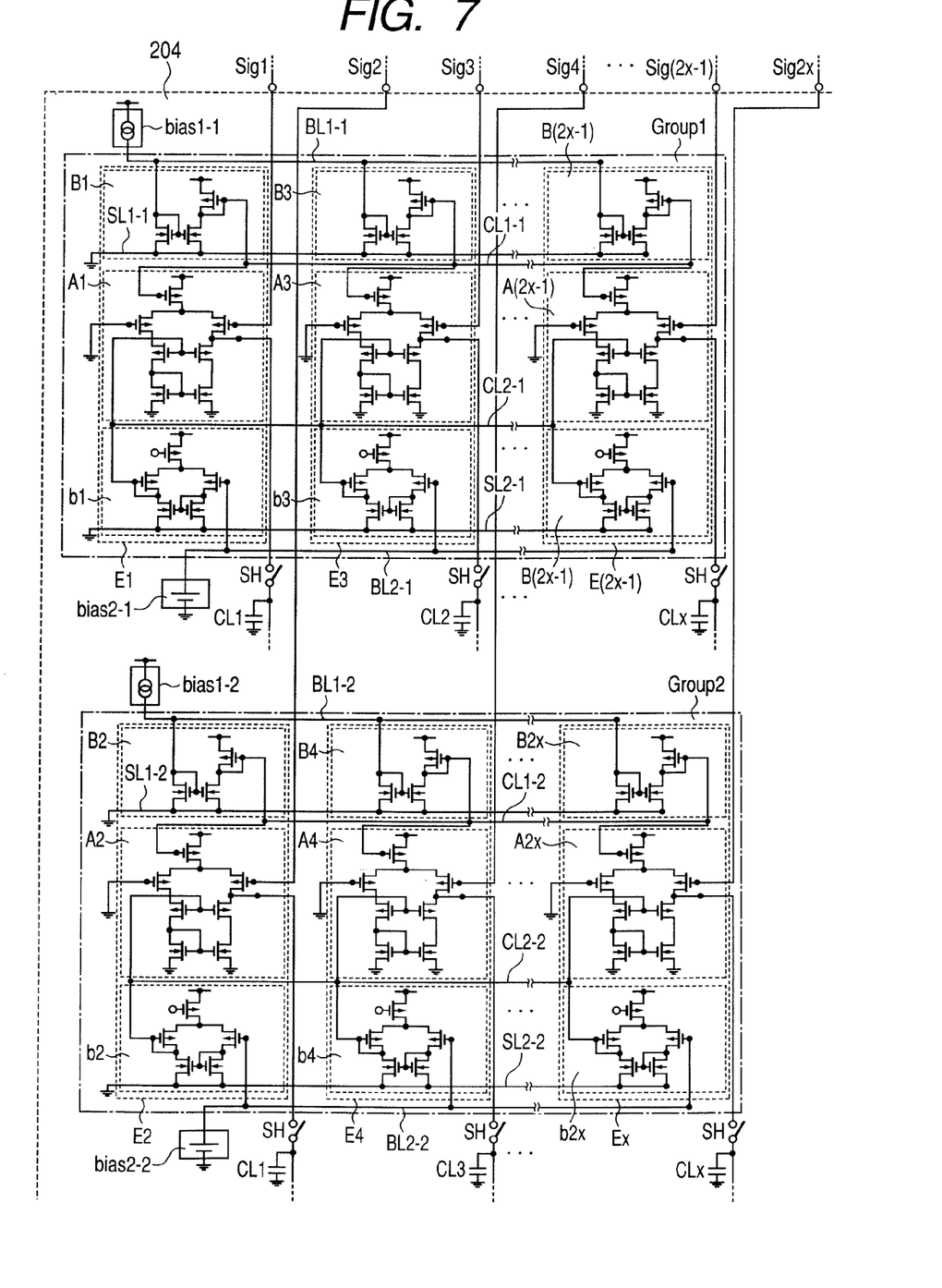
FIG. 7 is a schematic equivalent circuit diagram of a semiconductor integrated circuit device according to a second embodiment of the present invention.

The semiconductor integrated circuit device 204 according to the present embodiment will be described with reference to FIG. 7. Incidentally, the same components as those of the first embodiment are denoted by the same reference numerals or signs, and their descriptions are omitted. FIG. 7 is a schematic equivalent circuit diagram of a part of one of the semiconductor integrated circuit device 204 according to the present embodiment.

The present embodiment differs from the first embodiment in that the first group thereof includes x signal processing circuits E1 to E(2x−1) corresponding to the signal lines Sig1 to Sig(2x−1) of odd columns, and in that the second group thereof includes x signal processing circuits E2 to E2x corresponding to the signal lines Sig2 to Sig2x of even columns. That is, in the present embodiment, both of the signal processing circuits corresponding to predetermined signal lines among the plurality of signal lines Sig1 to Sig2x included in the detector 201 and the signal processing circuits corresponding to the signal lines being physically non-adjacent to the predetermined signal lines are included in each group of each of the semiconductor integrated circuit device 204. Then, similarly to the first embodiment, the plurality of signal processing circuits E1-En of each of the semiconductor integrated circuit device 204 is classified into a plurality of groups, and each of the semiconductor integrated circuit device 204 includes a plurality of connection wirings provided in each group separately. Then, in each group, the outside input terminals of the respective bias circuits are commonly connected to one another with the connection wirings provided in each group separately. Moreover, each of the semiconductor integrated circuit device 204 includes a plurality of bias sources, each of which is allotted to each group correspondingly to each of the groups of the signal processing circuits E1-En classified into the plurality of groups, and the bias sources of each group are correspondingly connected to the connection wirings of the group. Furthermore, in each group of each of the semiconductor integrated circuit device 204, the output terminals of the respective bias circuits are commonly connected with one another with the connection wirings, and are commonly connected to the bias input terminals of the respective amplifier circuits A1-An. In addition to the effects of the first embodiment, the present embodiment has the effect that the characteristic differences of the signal processing circuits E1-En are made to be difficult to recognize by increasing the special frequencies, at which the characteristic differences appear, to enable the further suppression of the remarkable lowering of the image quality of an image signal.

Incidentally, although the groups corresponding to the odd columns and even columns are provided in the present embodiment, the present invention is not limited this embodiment. For example, one group may be composed of a plurality of signal processing circuits E1-Ex corresponding to the signal lines in every two columns or every three columns, or one group may be composed of a plurality of signal processing circuits E1-Ex corresponding to the signal lines on every two couples of two continuous columns.

Third Embodiment

Next, a radiation imaging system using a radiation imaging apparatus, which is an imaging apparatus according to the present invention, will be described with reference to FIG. 8.

Figure 8:
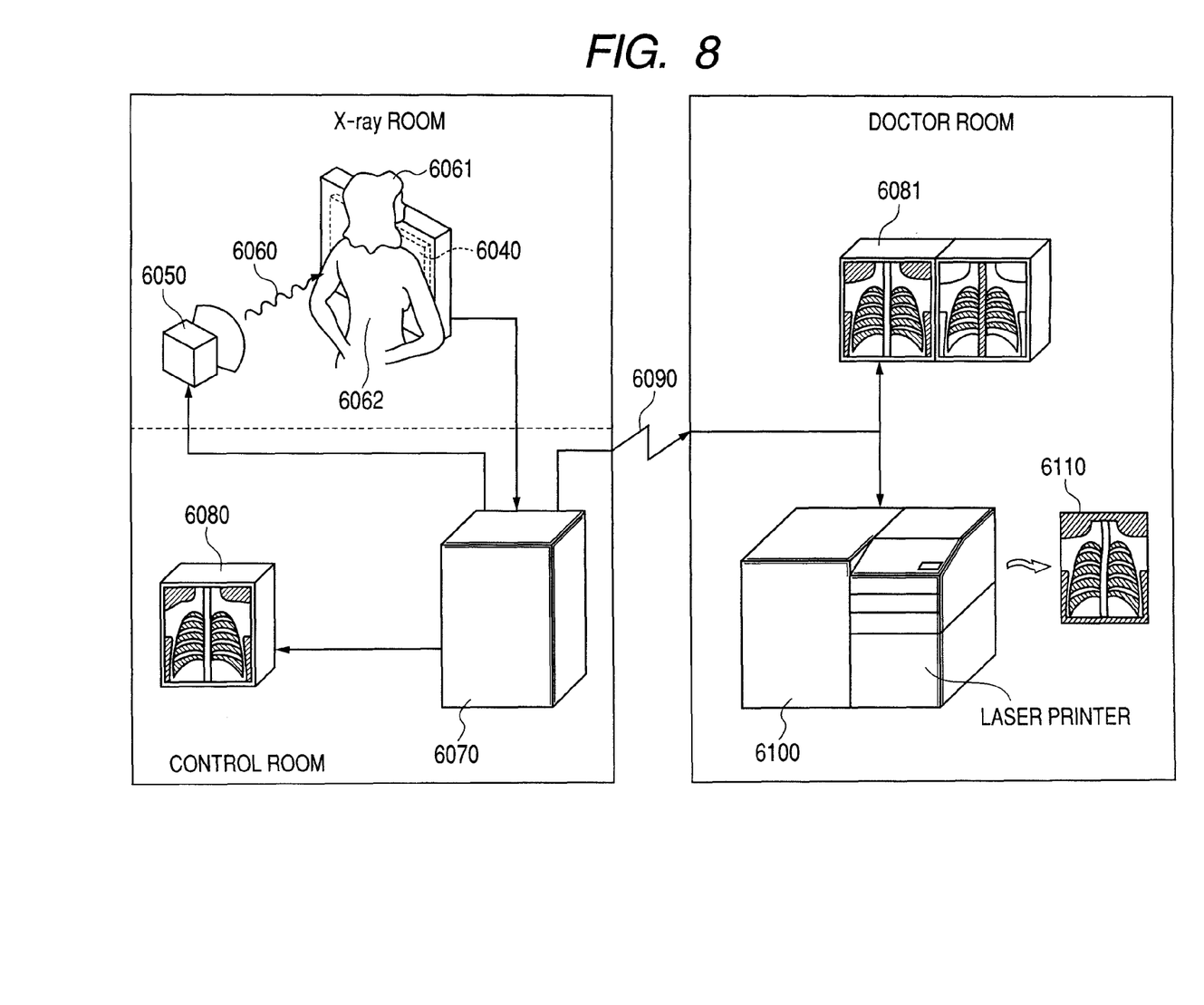
FIG. 8 is a schematic view illustrating a radiation imaging system using a radiation imaging apparatus, which is an imaging apparatus according to the present invention.
Figure 9:
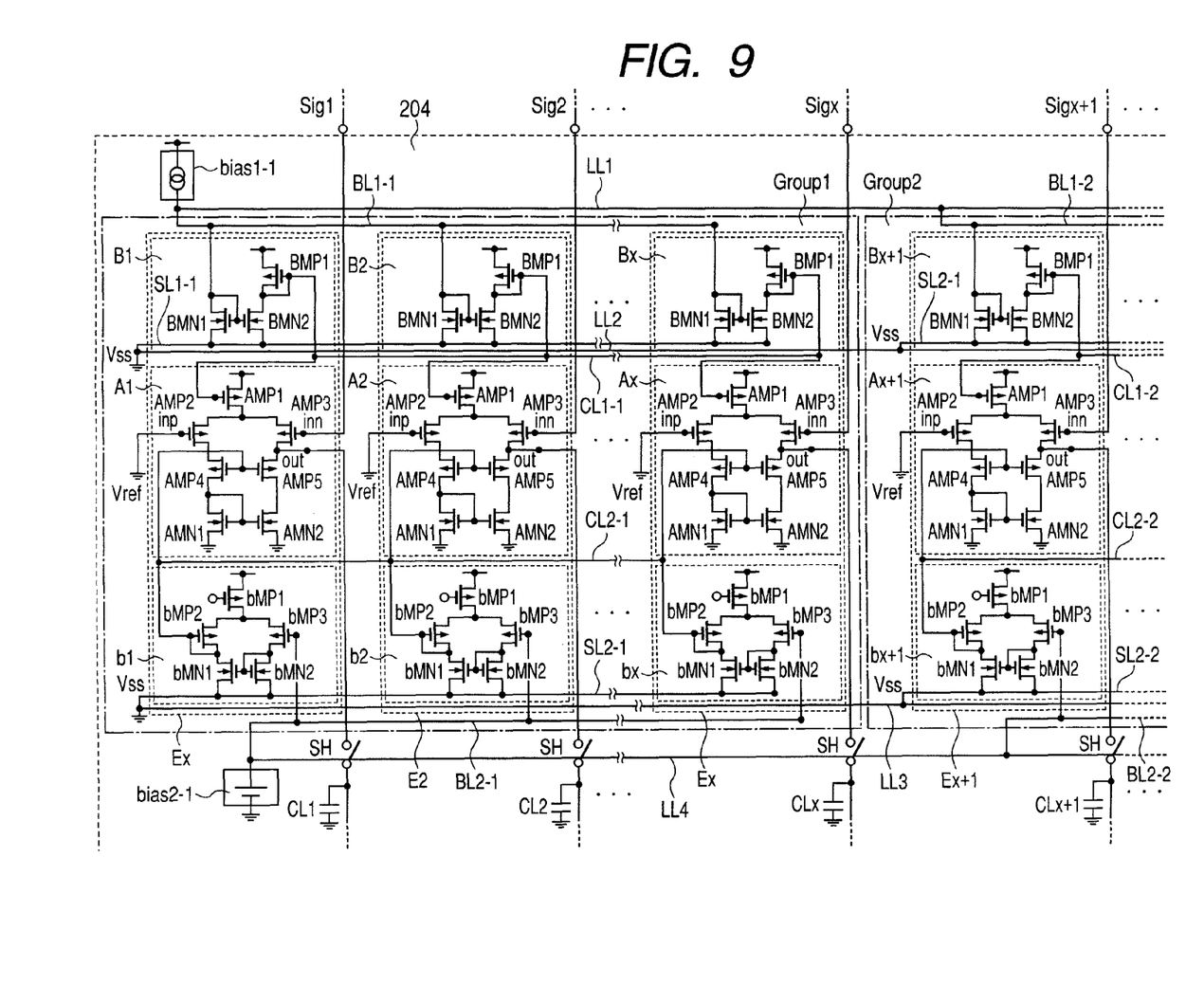
FIG. 9 is a schematic equivalent circuit diagram of a semiconductor integrated circuit device to be used in an imaging apparatus according to another embodiment of the present invention.

As illustrated in FIG. 8, an X-ray 6060 generated by an X-ray generating apparatus 6050, which is a radiation source, penetrates through the breast 6062 of a patient or subject 6061, and enters a radiation imaging apparatus 6040. The entered X-ray 6060 includes the information of the inside of the body of the patient 6061. The phosphor of the radiation imaging apparatus 6040 emits a light correspondingly to the incidence of the X-ray 6060, and the emitted light is photoelectrically converted. Electric information can be thus obtained. The information is converted into digital information, and is subjected to image processing by an image processor 6070, which is a signal processing unit. The processed image can be observed on a display 6080, which is a display unit in a control room.

Moreover, the information can be transferred to a remote place with a transmission processing unit, such as a telephone line 6090, and the transferred information can be displayed on a display 6081, which is a display unit in a doctor room at another place, or can be saved on a recording medium, such as an optical disk, by a recording unit, such as an optical disk apparatus. Consequently, a doctor at the remote place can carry out a diagnosis of the patient 6061. Moreover, the information can be also recorded on a film 6110 by a film processor 6100.

According to the present invention, a plurality of signal processing circuits of a semiconductor integrated circuit device is classified into a plurality of groups, and the semiconductor integrated circuit device includes a plurality of connection wirings provided into each of the groups separately. Then, the outside input terminals of respective bias circuits in each of the groups are commonly connected to one another with the connection wirings provided to each of the groups separately. Then, the connection by the connection wirings is separated every group. Hereby, the potential gradients generated by the wiring resistances of the connection wirings connected to bias sources and the currents flowing through the connection wirings are separated, and the output gradients of an image signal in row directions are separated in association with the separation of the potential gradients. This reduces the output gradients of the image signal and disperses the output gradients in the row directions, and consequently the remarkable lowering of the image quality of the image signal can be suppressed.

Moreover, according to the present invention, a semiconductor integrated circuit device includes a plurality of bias sources, which is allotted to each of the groups of signal processing circuits classified into the plurality of groups, and the bias sources in each of the groups are connected to the connection wirings corresponding to the group. Hereby, streaky noises, which can be generated in an image signal, are dispersed in row directions, and the streaky noises can be obscured. Consequently, the remarkable lowering of the image quality of the image signal can be suppressed.

Furthermore, according to the present invention, the output terminals of respective bias circuits can be electrically connected to one another in common with connection wirings in each of the groups in a semiconductor integrated circuit device, and the output terminals are commonly connected to the bias input terminals of each of the amplifier circuits. Hereby, the influences of the noises arising from the bias circuits are improved, and consequently the noise characteristics of the signal processing circuits are reduced. The image quality of an image signal thus becomes better.

Moreover, according to the present invention, by arranging the bias circuits separately from each other, a freedom in the circuit design for suitably achieving the low power consumption and a smaller area of the integrated circuit structure, and suitably adaptable to the image signal characteristics required can be provided.

Incidentally, the present invention is applied to a semiconductor integrated circuit device applicable to an imaging apparatus to be used for a medical radiation imaging apparatus, which converts a radiation, such as an X-ray and a γ-ray, into an electric signal to output an image signal, a digital camera, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2007-328737, filed Dec. 20, 2007, and No. 2008-307589, filed Dec. 2, 2008, which are hereby incorporated by reference herein in their entirety.

What is claimed is:
1. An integrated circuit device comprising:
a plurality of signal processing circuits classified into a plurality of groups, the plurality of signal processing circuits including a plurality of amplifier circuits having a plurality of bias input terminals and a plurality of bias circuits for supplying an operation bias to the plurality of amplifier circuits and having a plurality of input terminals connected electrically to a bias source and a plurality of output terminals connected electrically to the plurality of bias input terminals for supplying an operation bias to the amplifier circuit, each of the plurality of signal processing circuits including one of the plurality of amplifier circuits and one of the plurality of bias circuits; and a plurality of connection wirings arranged for each of the groups separately, wherein one of the plurality of connection wirings is commonly connected to a plurality of input terminals of a plurality of bias circuits in one of the plurality of groups, and another of the plurality of connection wirings is commonly connected to a plurality of input terminals of a plurality of bias circuits in another of the plurality of group.

2. The integrated circuit device according to claim 1, wherein a plurality of the bias sources are provided correspondingly to the plurality of groups, such that one of the plurality of the bias sources corresponding to one of the plurality of groups is electrically connected to the one of the plurality of connection wirings and such that another of the plurality of the bias sources corresponding to another of the plurality of the groups is electrically connected to another of the connection wirings.

3. The integrated circuit device according to claim 1, wherein the plurality of output terminals of the plurality of bias circuits in one of the plurality of groups are commonly connected electrically, and a plurality of output terminals of the plurality of bias circuits in another of the plurality of groups are commonly connected electrically.

4. The integrated circuit device according to claim 1, wherein one of the plurality of amplifier circuits has a transistor as a current source of that amplifier circuit, and one of the plurality of bias input terminals of that one of the amplifier circuits comprises a gate of the transistor as a current source of the amplifier circuit.

5. The integrated circuit device according to claim 1, wherein the one of the amplifier circuits comprises a common-gate circuit, and the bias input terminal of the one of the plurality of amplifier circuits includes a gate of a transistor constituting the common-gate circuit.

6. The integrated circuit device according to claim 1, wherein the one of the plurality of amplifier circuits comprises a transistor operating as a current source of that amplifier circuit, and a transistor constituting a common-gate circuit, and the one of the plurality of bias circuits comprises a first bias circuit having an output terminal connected electrically to a gate of the transistor operating as the current source of the one amplifier circuit, and a second bias circuit having an output terminal connected electrically to a gate of the transistor constituting the common-gate circuit.

7. The integrated circuit device according to claim 3, wherein the plurality of signal processing circuits total n in number, the plurality of signal processing circuits in one of the groups are x in number, and a total number n/x of the groups is 10-13, where n is a natural number, and x is a natural number not less than 2 and not more than n, and is a divisor of n.

8. An imaging apparatus comprising:

a detector including a plurality of pixels each including a conversion element for converting radiation or light into an electric signal, and a plurality of signal lines for transmitting in parallel the electrical signals outputted from the pixels; and an integrated circuit device into which are input the electrical signals transmitted in parallel, wherein the integrated circuit device comprises:

a plurality of signal processing circuits classified into a plurality of groups corresponding to the plurality of signal lines, the plurality of signal processing circuits including a plurality of amplifier circuits for amplifying the electrical signal inputted and having a plurality of bias input terminals, and a plurality of bias circuits for supplying an operation bias to the plurality of amplifier circuits and having a plurality of input terminals connected electrically to a bias source and a plurality of output terminals connected electrically to the plurality of bias input terminals, each of the plurality of signal processing circuits including one of the plurality of amplifier circuits and one of the plurality of bias circuits; and a plurality of connection wirings arranged for each of the groups separately, wherein one of the plurality of connection wirings is commonly connected to a plurality of input terminals of a plurality of bias circuits in one of the plurality of groups, and another of the plurality of connection wirings is commonly connected to a plurality of input terminals of a plurality of bias circuits in another of the plurality of groups.

9. The imaging apparatus according to claim 8, wherein one of the plurality of signal processing circuits corresponding to a predetermined signal line among the plurality of signal lines and another of the plurality of signal processing circuits corresponding to another signal line physically arranged non-adjacent to the predetermined signal line are included in the one of the groups, and that other signal processing circuit corresponding to that other signal line physically arranged adjacent to the predetermined signal line is included in that other of the groups different from the one of the groups.

10. The imaging apparatus according to claim 8, wherein the integrated circuit device includes a plurality of the bias sources provided correspondingly to the plurality of groups, such that one of the plurality of the bias sources corresponding to the one of the plurality of groups is electrically connected to the one of the plurality of connection wirings, and such that another of the plurality of the bias sources corresponding to that other of the plurality of groups of the groups is electronically connected to that other of the connection wirings.

11. The imaging apparatus according to claim 8, wherein the plurality of output terminals of the plurality of bias circuits in the one of the plurality of groups are commonly connected electrically, and a plurality of output terminals of the plurality of bias circuits in that other of the plurality of groups are commonly connected electronically.

12. The imaging apparatus according to claim 11, wherein the integrated circuit device includes the signal processing circuits which total n in number, the signal processing circuits in one of the groups are x in number, and a total number n/x of the groups is 10-13, where n is a natural number, and x is a natural number not less than 2, and not more than n, and is a divisor of n.

13. The imaging apparatus according to claim 12, wherein the pixels of the detector are arranged in N columns, the integrated circuit devices are arranged such that one of the integrated circuit devices is connected through the signal lines to n columns of the pixels among the N columns of the pixels, and the integrated circuit devices total N/n in number.

14. A radiation imaging system comprising:

an imaging apparatus; and an output signal processing unit for processing a signal outputted from the imaging apparatus, wherein the image apparatus comprises:

a detector including a plurality of pixels each including a conversion element for converting radiation or light into an electric signal, and a plurality of signal lines for transmitting in parallel the electrical signals outputted from the pixels; and an integrated circuit device into which are input the electrical signals transmitted in parallel, wherein the integrated circuit device comprises:

a plurality of signal processing circuits classified into a plurality of groups corresponding to the plurality of signal lines, the plurality of signal processing circuits including a plurality of amplifier circuits for amplifying the electrical signal inputted and having a plurality of bias input terminals, and a plurality of bias circuits for supplying an operation bias to the plurality of amplifier circuits and having a plurality of input terminals connected electrically to a bias source and a plurality of output terminals connected electrically to the plurality of bias input terminals, each of the plurality of signal processing circuits including one of the plurality of amplifier circuits and one of the plurality of bias circuits; and a plurality of connection wirings arranged for each of the groups separately, wherein one of the plurality of connection wirings is commonly connected to a plurality of input terminals of a plurality of bias circuits in one of the plurality of groups, and another of the plurality of connection wirings is commonly connected to a plurality of input terminals of a plurality of bias circuits in another of the plurality of groups.

* * * * *